(12) United States Patent
Arimoto

(10) Patent No.: US 6,249,474 B1
(45) Date of Patent: *Jun. 19, 2001

(54) SEMICONDUCTOR MEMORY DEVICE FOR MULTI-BIT OR MULTI-BANK ARCHITECTURES

(75) Inventor: Kazutani Arimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/053,677

(22) Filed: Apr. 2, 1998

Related U.S. Application Data

(63) Continuation of application No. 08/787,483, filed on Jan. 22, 1997, now Pat. No. 5,781,495.

(30) Foreign Application Priority Data

Jul. 23, 1996 (JP) .................................................. 8-193757

(51) Int. Cl.[7] .................................................. G11C 13/00
(52) U.S. Cl. ...................................... 365/230.03; 365/63
(58) Field of Search ........................ 365/230.03, 230.01, 365/63, 51, 189.01

(56) References Cited

U.S. PATENT DOCUMENTS

| 5,471,430 | 11/1995 | Sawada | 365/230.03 |
| 5,603,009 | 2/1997 | Konishi | 365/230.03 |
| 5,734,620 | * 3/1998 | Seyyedy | 365/230.03 |

FOREIGN PATENT DOCUMENTS 5-54634  3/1993 (JP) .

* cited by examiner

Primary Examiner—A. Zarabian
(74) Attorney, Agent, or Firm—McDermott, Will & Emery

(57) ABSTRACT

In a semiconductor memory device, global column-select lines are provided for selecting specific memory-cell arrays in accordance with select signals, and a pair of global input/output signal line is provided for each memory-cell array and connected to a pair of local input/output signal lines associated with the memory-cell array on a one-to-one basis to implement a multi-bank architecture. Alternatively, each pair of local input/output signal lines is divided into pairs of partial local input/output signal lines which are each connected to a pair of global input/output signal lines on a one-to-one basis. A memory-cell architecture is provided which has a number of data buses corresponding to an increased number of divided memory-cell arrays or memory banks to meet demands for a multi-bank and multi-bit semiconductor memory device.

22 Claims, 13 Drawing Sheets

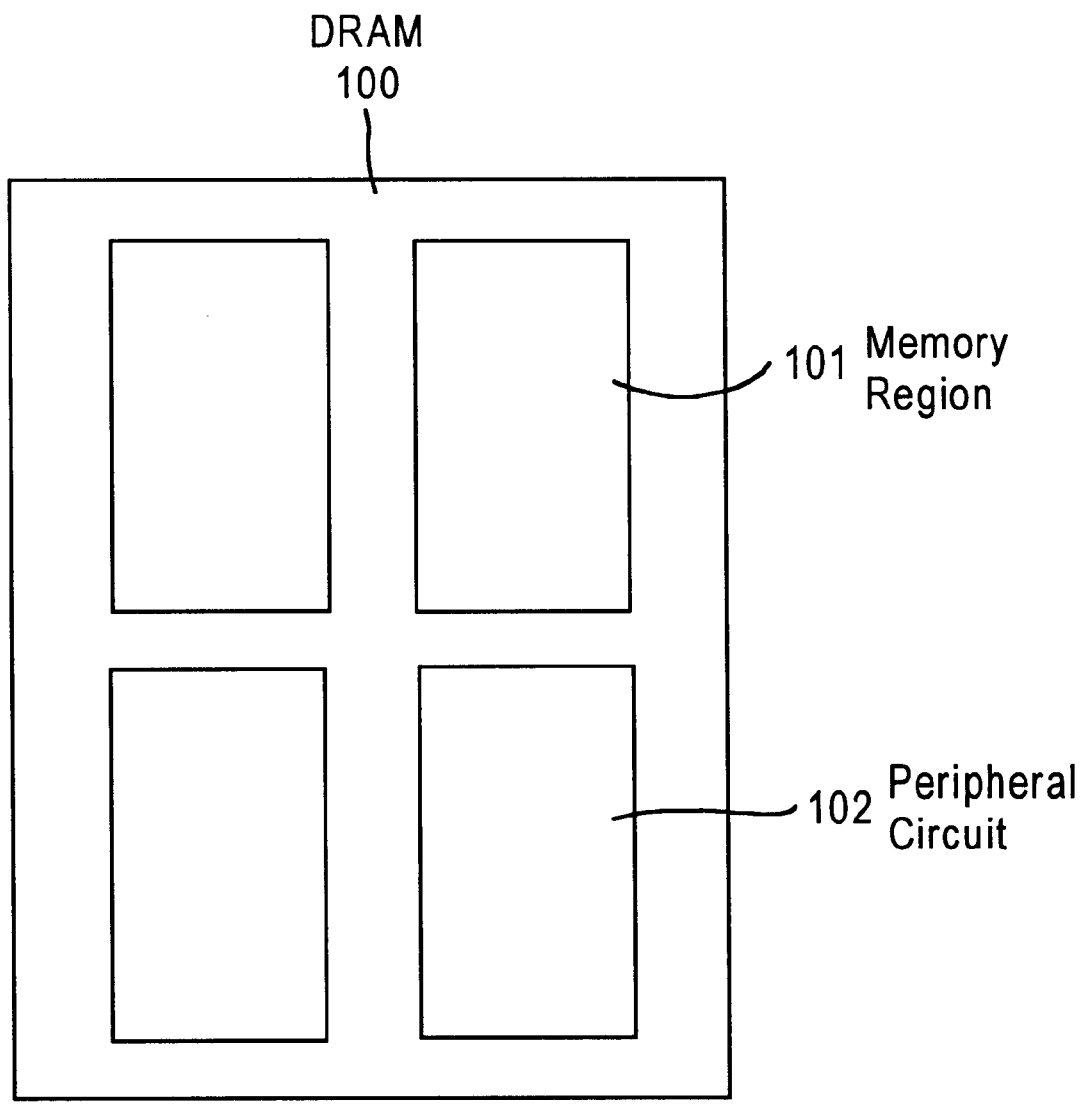

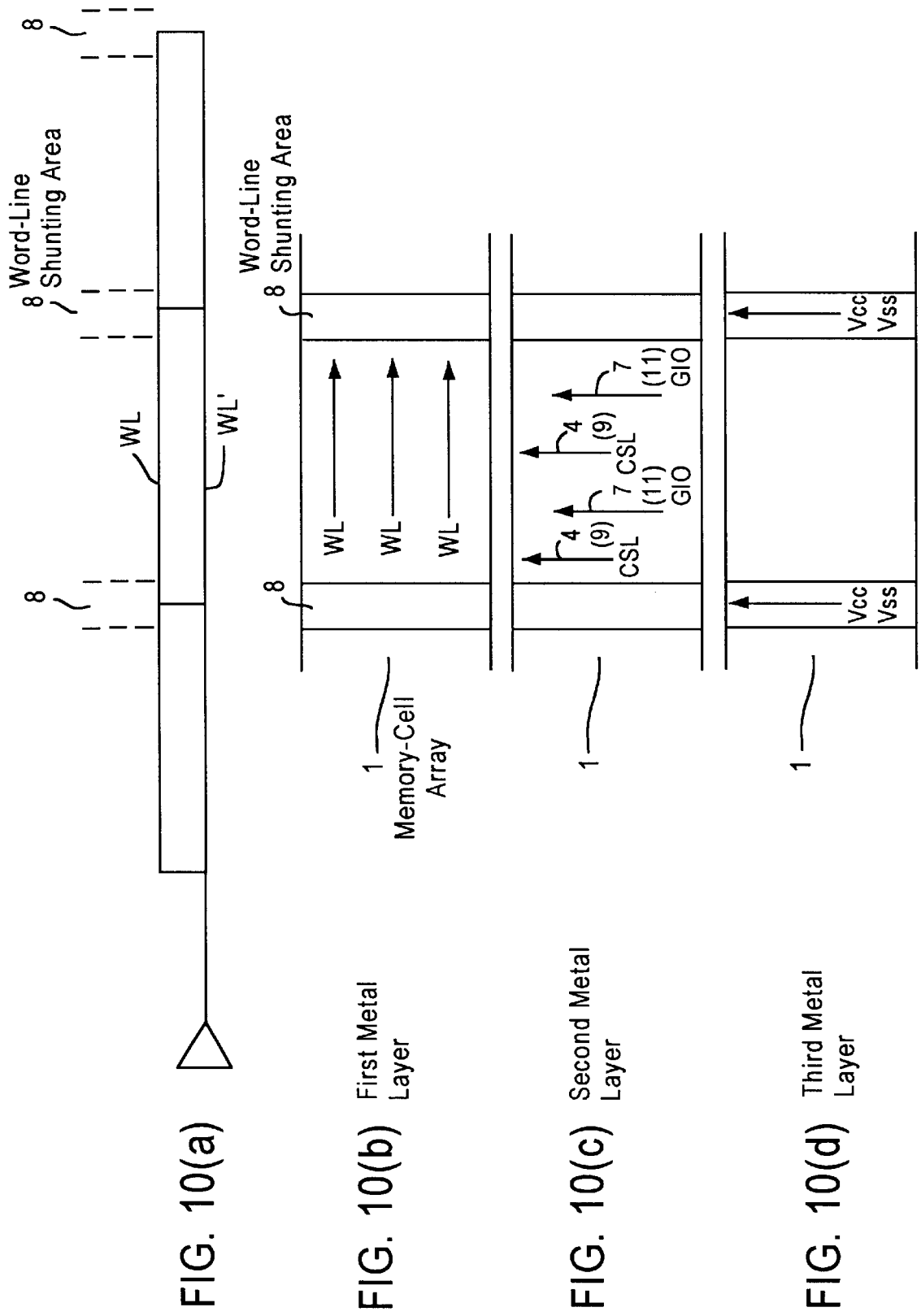

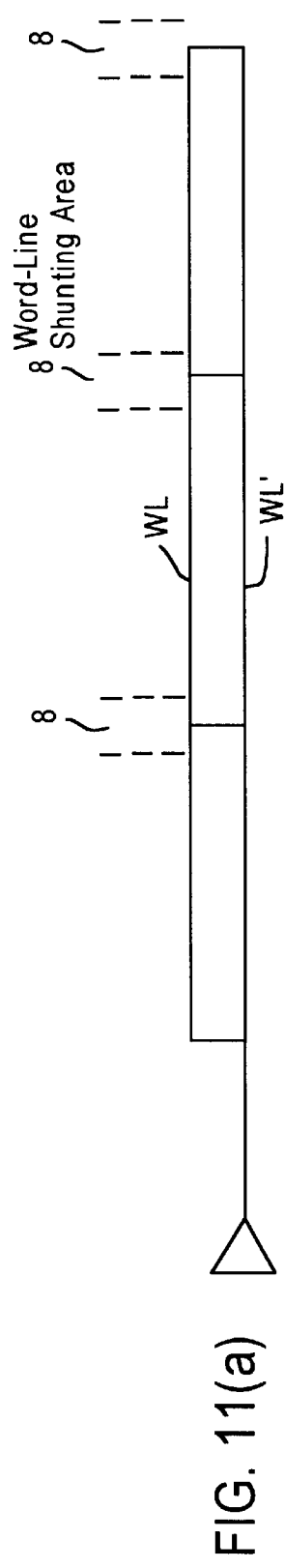
FIG. 11(a)
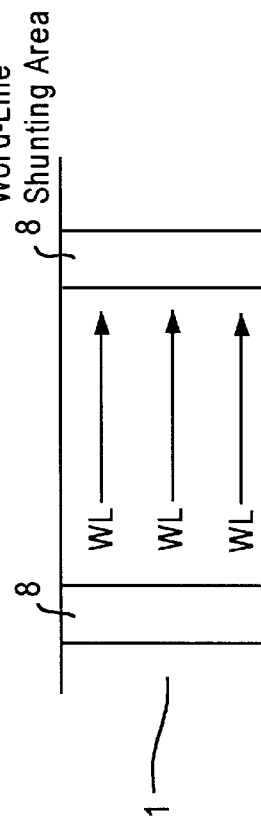
FIG. 11(b) First Metal Layer
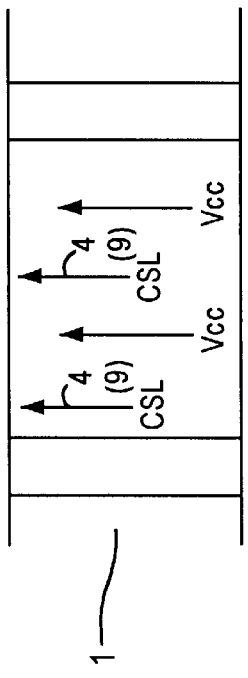
FIG. 11(c) Second Metal Layer
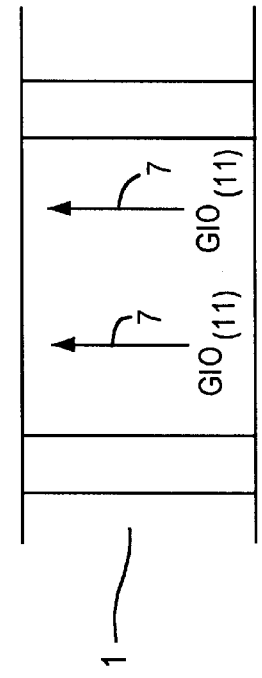
FIG. 11(d) Third Metal Layer

SEMICONDUCTOR MEMORY DEVICE FOR MULTI-BIT OR MULTI-BANK ARCHITECTURES

This application is a Continuation of application Ser. No. 08/787,483 filed Jan. 22, 1997 U.S. Pat. No. 5,781,495.

TECHNICAL FIELD

The present invention relates in general to a semiconductor memory device, and in particular to a semiconductor memory device having a multi-bit architecture or a multi-bank architecture.

BACKGROUND ART

FIG. 12 is a diagram showing an architecture of a memory-cell array in a dynamic random-access memory (DRAM) as a typical conventional semiconductor memory device. As shown in the figure, memory-cell arrays (or memory banks) 206 each comprising a number of memory cells laid out to form a matrix are separated from each other in a bit-line direction by sense-amplifier units 207. The memory-cell arrays 206 are separated in a word-line direction by a word-line shunting area 208 in the case of a word-line shunt system or by a sub-word driver area 208 in the case of a split word-line architecture.

Data is read out and latched in the sense-amplifier units 207. Column-select lines (CSL) 209 are activated in accordance with a column address, causing the data to be output from the sense-amplifier units 207 to pairs of local I/O lines 210. The pairs of local I/O lines 210 are connected to a pair of global I/O lines 211 which is located on the word-line shunting area or the sub-word driver area 208 to form a data route in a read/write operation.

A switch 212 is provided between each of the pairs of local I/O lines 210 and the pair of global I/O lines 211. Only a single switch 212 associated with a selected memory-cell array 206 is turned on. Normally, the switch 212 is located at the intersection of the sense-amplifier unit 207 and the word-line shunting area or the sub-word driver area 208. In a CSL system, the pair of local I/O lines 210 associated with a selected memory-cell array 206 is connected to the pair of global I/O lines 211. If the switches 212 are not provided, all the pairs of local I/O lines 210 are connected to the pair of global I/O lines 211, increasing the load on a data bus. In addition, it is generally necessary to set the precharge potentials of selected pairs of local I/O lines 210 and deselected pairs of local I/O lines 210 at different values from the access-speed point of view.

In recent years, there has been a trend of increasing the number of bits per word to keep up with increases in capacity. Demands for DRAMs with an x32/x64/x128 word structure are anticipated. Demands for multi-bank and multi-bit specifications are also foreseen for synchronous DRAMs. To meet such demands, it is necessary to incorporate a number of data buses from memory-cell arrays. In this case, it is necessary to design architectures of memory-cell arrays and data buses that do not require an increase in memory-cell-array area, that reduce the number of activated memory-cell arrays by as many as possible, and that reduce the amount of consumed current at the same time Meeting such demands with a memory-array architecture like the one shown in FIG. 12 would increase the loads connected to the column-select lines and the global I/O signal lines. In addition, the memory-architecture cannot sufficiently keep up with increases in bit count and memory-bank count. The present invention addresses these problems.

DISCLOSURE OF THE INVENTION

It is thus an object of the present invention to provide a semiconductor memory device that has memory-cell arrays scalable for conversion into a multi-bit or a multi-bank architecture. In particular, it is an object of the present invention to provide a preferred semiconductor memory device that can be implemented as a DRAM having a multi-bit architecture or a DRAM having a multi-bank architecture.

According to one aspect of the present invention, a semiconductor memory device comprises a plurality of memory-cell arrays each of which includes a plurality of memory cells arranged in a matrix form. A plurality of sense amplifiers is associated with each column of each memory-cell array. A plurality of column-select lines extends through the memory-cell arrays, each line in a column. Each column-select lines is connected to one of the sense amplifiers in the column in accordance with a column-select signal. A plurality of global input/output signal line pairs extends through the memory-cell arrays each in a column, and is connected commonly to the sense amplifiers in the column of the memory-cell arrays.

In another aspect of the present invention, in the semiconductor memory device, each global input/output signal line pair extends through the memory-cell arrays in a column and is disposed along the column on an upper layer of the plurality of memory cells arranged in the memory-cell array.

According to another aspect of the present invention, a semiconductor memory device comprises a plurality of memory-cell arrays each including a plurality of memory cells in a matrix form. A plurality of sense amplifiers is associated with each column of the memory-cell arrays. A plurality of column-select lines extends through the memory-cell arrays each in a column, and each column-select line is connected electrically to one of the sense amplifiers in the column in accordance with a column-select signal. A plurality of local input/output signal line pairs is provided, each of which is commonly connected to the sense amplifiers in each memory-cell array. A plurality of global input/output signal line pairs extends through the memory-cell arrays and disposed corresponding to each local input/output signal line pair. Each global input/output signal line pair is connected to the corresponding local input/output signal line pairs associated with each memory-cell array.

In another aspect of the present invention, in the semiconductor memory device, each global input/output signal line pair extends through the memory-cell arrays in each column, and is connected to each local input/output signal line pair associated with the memory-cell array on a one-to-one basis.

In another aspect of the present invention, in the semiconductor memory device, each global input/output signal line pair extends through the memory-cell arrays in each column, and is disposed along the column on an upper layer of the plurality of memory cells arranged in the memory-cell array.

In another aspect of the present invention, in the semiconductor memory device, each column-select line is connected commonly to the sense amplifiers on the same column in the memory-cell arrays.

In another aspect of the present invention, in the semiconductor memory device, each column-select line is selectively connected electrically to one of the sense amplifiers on the same column in the memory-cell arrays in accordance with a column-select signal.

In another aspect of the present invention, in the semiconductor memory device, each local input/output signal line pair is divided into a plurality of partial local input/output signal line pairs, and each global input/output signal line pair is connected to each partial local input/output signal line pair on a one-to-one basis.

In another aspect of the present invention, in the semiconductor memory device, each memory-cell array is divided into partial memory-cell arrays, and each partial memory-cell array is connected to each global input/output signal line pair on a one-to-one basis.

In another aspect of the present invention, for each semiconductor memory device as stated above, a conductive lead structure is provided on said memory-cell arrays. The conductive lead structure comprises a first layer of word-lines, a second layer of column-select lines and global input/output signal line pairs, and a third layer of power-supply lines.

In another aspect of the present invention, in each of the semiconductor memory device as stated above, a conductive lead structure is provided on said memory-cell arrays. The conductive lead structure comprises a first layer of the word-lines, a second layer of column-select lines and power-supply lines, and a third layer of global input/output signal line pairs.

Additional advantages and other features of the invention are set forth in the following description and some will become apparent to those having ordinary skill in the art upon examination of the following or learned from practice of the invention. The objects and advantages of the invention are realized and attained as particularly pointed out in the appended claims.

BRIEF DESCRIPTION OF DRAWINGS

FIG. 1A is a diagram showing the architecture of memory-cell arrays in a semiconductor memory device of a first embodiment of the present invention;

FIG. 10($a$) to 10($d$) are diagrams showing the architecture of memory-cell arrays in a semiconductor memory device of an eighth embodiment;

FIG. 11($a$) to 11($d$) are diagrams showing the architecture of memory-cell arrays in a semiconductor memory device of the eighth embodiment.

BEST MODE FOR CARRYING OUT THE INVENTION

The present invention will become more apparent from the following detailed description of some preferred embodiments with reference to accompanying diagrams showing the embodiments.

First Embodiment

Figure 1B:
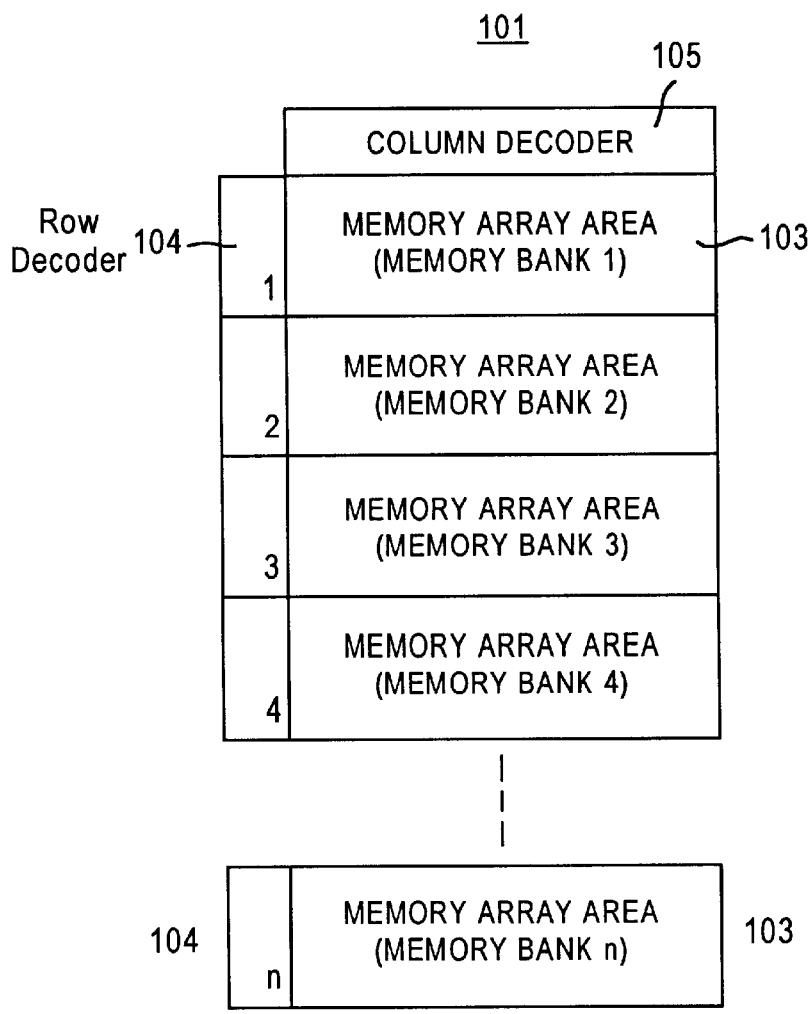
FIG. 1B is a diagram showing the architecture of memory-cell arrays in a semiconductor memory device of the first embodiment.
Figure 1C:
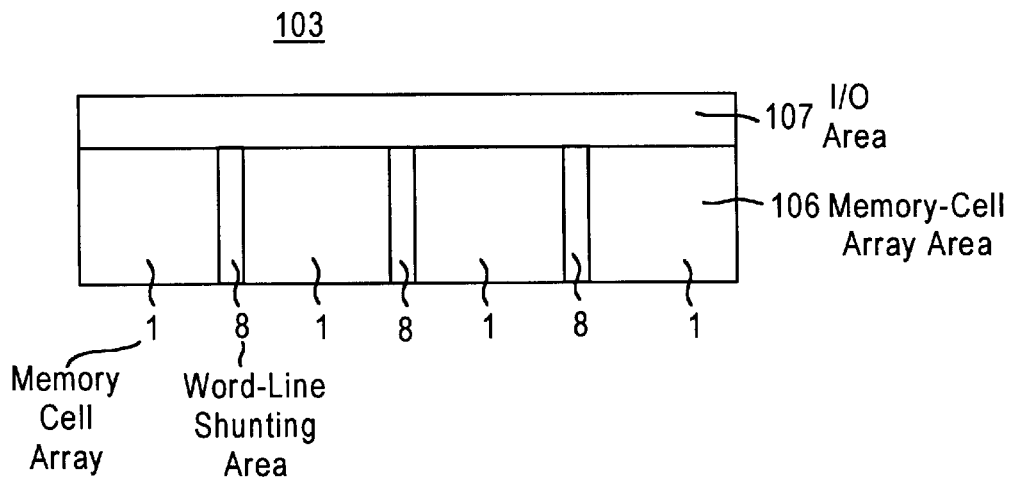
FIG. 1C is a diagram showing the architecture of S memory-cell arrays in a semiconductor memory device of the first embodiment.

FIGS. 1A to 1C and FIG. 2 are diagrams showing a semiconductor memory device of a first embodiment of the present invention. In particular, FIGS. 1A to 1C are diagrams showing skeleton configurations common to semiconductor memory devices of embodiments of the present invention. The figures show a typical configuration of memory-cell arrays in a dynamic random-access memory (DRAM). First, as shown in FIG. 1A, a DRAM memory chip 100 comprises four memory regions 101 and a peripheral circuit 102. In addition, each memory region 101 comprises a plurality of memory-cell array region (or memory bank) 103 as shown in FIG. 1B. Each memory-cell array region (or memory bank) 103 has a row decoder 104. Each memory region 101 also includes a column decoder 105 common to all the memory-cell array regions (or memory banks) 103. As shown in FIG. 1C, each memory-cell array region (or memory bank) 103 is divided in a bit-line direction into a memory-cell array area 106 and an area 107 for I/O-gate units and sense amplifiers. The memory-cell array area 106 is further divided in a word-line direction into memory-cell arrays 1 and wordline shunting areas 8 in the case of a word-line shunt system or sub-word-driver areas 8 in the case a split word-line architecture.

Figure 2:
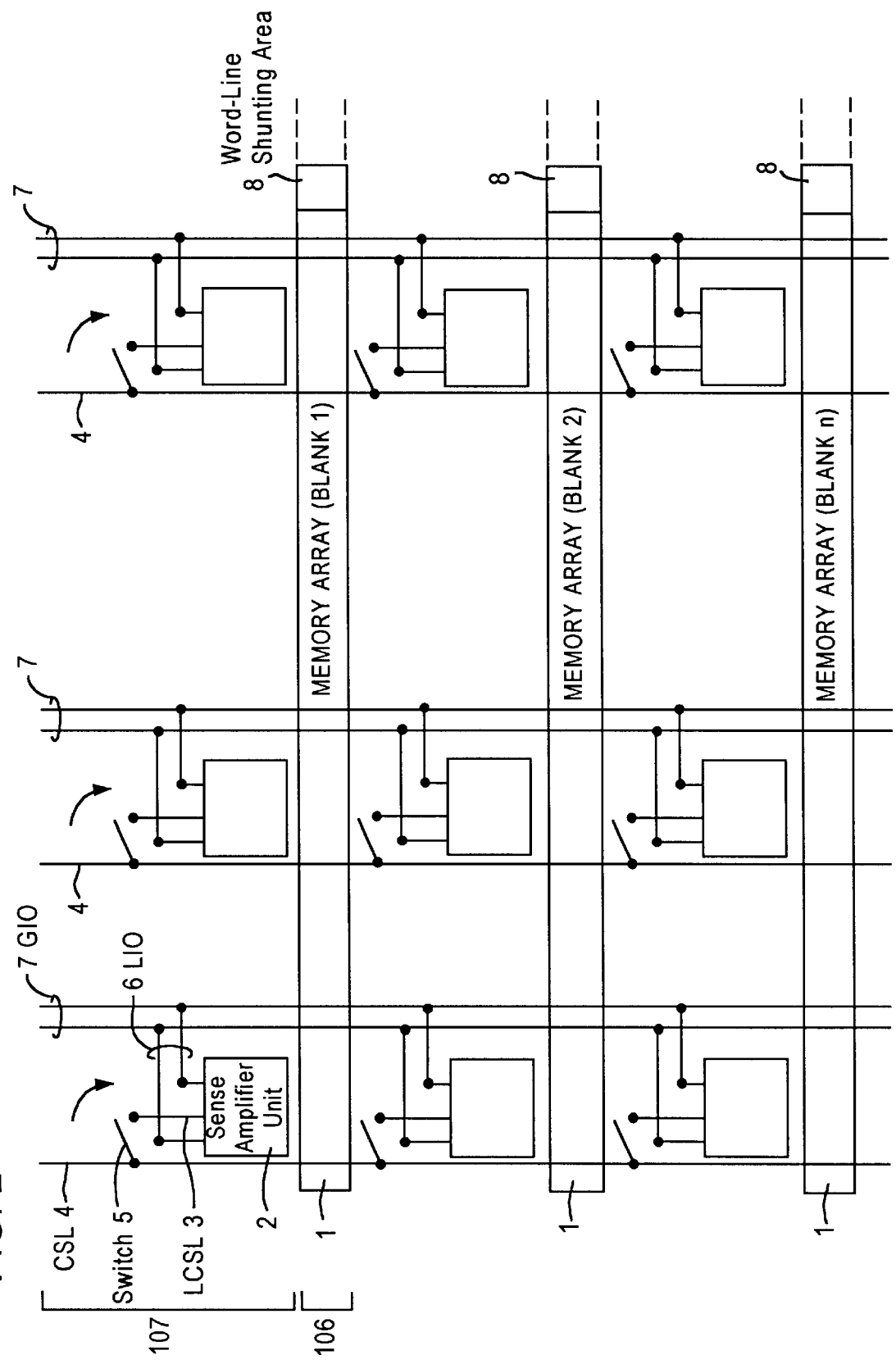
FIG. 2 is a diagram showing the architecture of memory-cell arrays in a semiconductor memory device of the first embodiment.

FIG. 2 is a diagram used for explaining the architecture of memory-cell arrays in the first embodiment. The first embodiment is an example in which a multi-bit bus is formed from the memory-cell arrays.

In FIG. 2, the semiconductor memory device includes memory-array areas 106 and the areas 107 for I/O-gate units and sense amplifiers as shown in FIGS. 1A to 1C. Further, the semiconductor memory device includes a memory-cell array 1 (or a memory bank 1) and a sense amplifier and an I/O gate unit 2 associated with the memory-cell array 1. Hereinafter, the sense amplifier and the I/O gate unit 2 is simply referred to as a sense-amplifier unit 2. A short local column-select line 3 is connected to the sense-amplifier unit 2. A global column-select line (CSL) 4 is associated with each column of sense-amplifier units 2. The global column-select line (CSL) 4 is a component common to all the sense-amplifier units 2 in the column to which the global column-select line (CSL) 4 is associated. A switch 5 turns on and off the electrical connection between the local column-select line 3 and the global column-select line (CSL) 4. A pair of short local input/output signal lines 6 (or a pair of local I/O lines 6) is connected to the sense-amplifier unit 2.

A pair of long global input/output signal lines 7 (or a pair of global I/O lines 7) is associated with each column of sense-amplifier units 2 as components common to the sense-amplifier units 2. Either a word-line pile-driving unit 8 or a sub-word-line driving unit 8 is provided at the edge of each of the memory-cell arrays 1 for separating adjacent memory-cell arrays 1 from each other.

Figure 3:
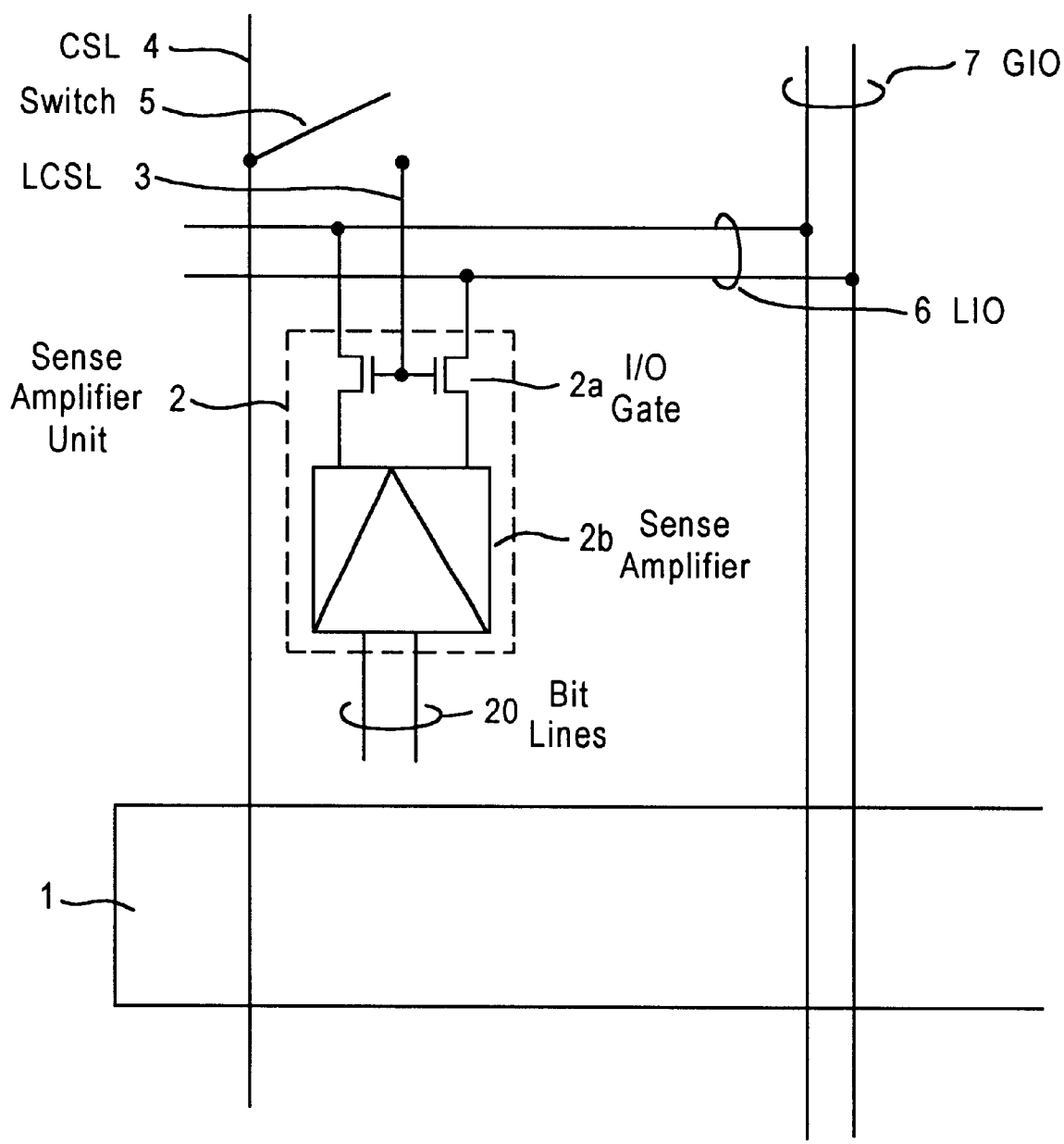
FIG. 3 is a diagram showing the architecture of memory-cell arrays in a semiconductor memory device of the first embodiment.

FIG. 3 is a diagram showing an architecture of the sense-amplifier unit 2 and its peripheral circuitry shown in FIG. 2. The column-select line (CSL) 4 is connected through an I/O gate transistor 2a to a sense amplifier 2b. A pair of bit lines 2c is connected to each memory cell from the sense amplifier 2b.

As shown in FIG. 2, a plurality of memory-cell arrays (or memory banks) 1 is laid out in the memory-array areas 106 of the first embodiment. A column-select line (CSL) passing through the memory-cell arrays (or memory banks) 1 is configured into a hierarchical structure comprising a local line 3 at a local level and a global line 4 at a global level. In addition, the pair of global input/output signal lines 7 passing through the memory-cell arrays (or memory banks) 1 is connected to each sense-amplifier unit 2 by the pair of short local input/output signal lines 6 associated only with the sense amplifier in the sense-amplifier unit 2. Unlike the conventional architecture, a pair of common local input/output signal lines is no longer required for the plurality of sense amplifiers. As a result, each column of sense amplifiers has a pair of global input/output signal lines 7 and a global column-select line (CSL) 4 which are associated with each other in a one-to-one relation. As a result, a data bus is formed comprising a number of bits for each sense-amplifier unit 2 or, in other words, for each global column-select line (CSL) 4.

In the semiconductor memory device having an architecture shown in FIG. 3, data is read out by the sense amplifier 2b and latched in the sense-amplifier unit 2. The global column-select line (CSL) 4 is activated in accordance with a column address. The column-select line switch 5 of a selected memory-cell array 1 is turned on, putting the I/O gate transistor 2a in a conductive state. As a result, the sense amplifier 2b connects to the pair of global input/output signal lines 7 directly, creating a route for data in a read or write operation.

In the architecture of memory-cell arrays provided by the first embodiment described above, a column-select line switch associated with a selected memory-cell array is turned on, connecting the global column-select line to the local column-select line. As a result, the I/O gate is put in a conductive state, allowing the sense amplifier to directly connect to the pair of global I/O lines. According to this architecture, a multi-bit data bus is formed by the selected pairs of global input/output signal lines according to the global column-select lines, allowing a multi-bit signal to be fetched. It should be noted that in this architecture the data bus can also be formed by turning on only certain column-select line switches associated with selected memory cells.

Second Embodiment

Figure 4:
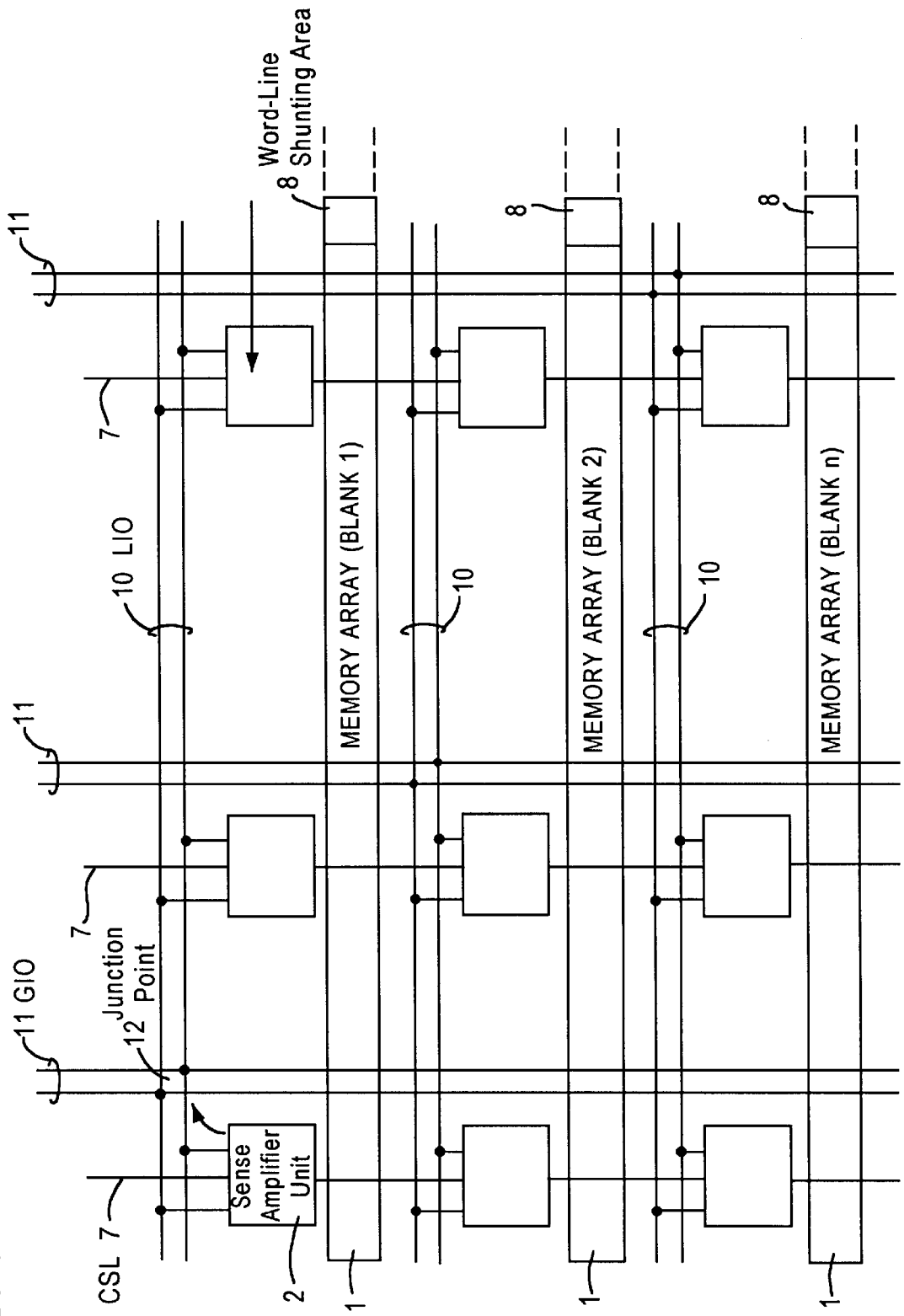
FIG. 4 is a diagram showing the architecture of memory-cell arrays in a semiconductor memory device of a second embodiment.

FIG. 4 is a diagram showing the architecture of memory-cell arrays in a semiconductor memory device of a second embodiment of the present invention. For the second embodiment, a memory bank is associated with each memory-cell array to provide a multi-bank architecture.

In FIG. 4, the semiconductor memory device includes a memory-cell array 1 (cr a memory bank 1) and a sense-amplifier unit 2 associated with the memory-cell array 1 respectively. A column-select line 7 is commonly connected to sense amplifiers 2 of the same column of the memory-cell arrays 1. A pair of local input/output signal lines 10 (or a pair of local I/O lines 10) is commonly connected to a plurality of sense-amplifier units 2 of each memory-cell array 1 (or memory bank 1). A pair of long global input/output signal lines 11 (or a pair of global I/O lines 11) is connected to a specific pair of local input/output signal lines 10. Either a word-line pile-driving unit 8 or a sub-word-line driving unit 8 is provided at the edge of each of the memory-cell arrays 1 for separating adjacent memory-cell arrays 1 from each other.

As shown in FIG. 4, a plurality of memory-array units (or a plurality of memory banks) 1 is laid out in the memory-array areas of the second embodiment. The pair of global input/output signal lines 11 passes through the memory-cell arrays (or the memory banks) 1. However, a pair of global input/output signal lines 11 is connected at a junction point 12 only to a single pair of local input/output signal lines 10 corresponding to a memory-cell array (or one memory bank) 1. That is to say, a pair of global input/output signal lines 11 is associated only with the specific memory-cell array (or the specific memory bank) 1, outputting and inputting only those signals to and from the specific memory-cell array 1.

In the semiconductor memory device having the architecture described above, signals are input from or output to a selected memory-cell array (or a selected memory bank) 1 through a pair of global input/output signal lines 11 associated with the memory-cell array (or the memory bank) 1. As a result, more than one memory-cell array (or memory bank) 1 can operate concurrently in a multi-bank operation.

In general, in a memory device with a plurality of memory-cell arrays, one memory-cell array is selected and activated for receiving or transmitting data. Then, after this memory-cell array is reset and put back into a precharge state, the next memory-cell array is selected.

However, with an increasing amount of processed data, it becomes necessary to activate two or even more memory-cell arrays concurrently to input from and output data to the selected memory-cell arrays. Therefore, there may be cases in which a memory-cell array needs to be activated, while another memory-cell array is active. For this reason, this memory-cell array is referred to as a memory bank to distinguish its concurrent use from the ordinary usage of the memory-cell array described previously. Also in the description of the present invention, the technical term memory bank implies this meaning.

Now, let one memory bank 1 of the semiconductor memory device shown in FIG. 4 be activated. Data is read out from or written to the activated memory bank 1 through a data bus created through a pair of local I/O lines 10 and a pair of global I/O lines 11 connected to the activated memory bank 1. When another memory bank 1 is activated while the previously activated memory bank 1 remain s active, data is read out from or written into the other activated memory bank 1 through a data bus created by a different pair of local I/O lines 10 and global I/O lines 11 connected to the other memory bank 1. In this architecture, there is no data collision among different memory banks 1, allowing for the implementation of memory-cell arrays of a multi-bank DRAM.

In the architecture shown in FIG. 4, each divided memory-cell array is associated with a global column-select line 7. As a result, in a multi-bank architecture such as a synchronous DRAM, each divided memory cell array can be associated with a memory bank. Thus, a multi-bank architecture in which each memory cell array is designated as a memory bank can be implemented.

Third Embodiment

Figure 5:
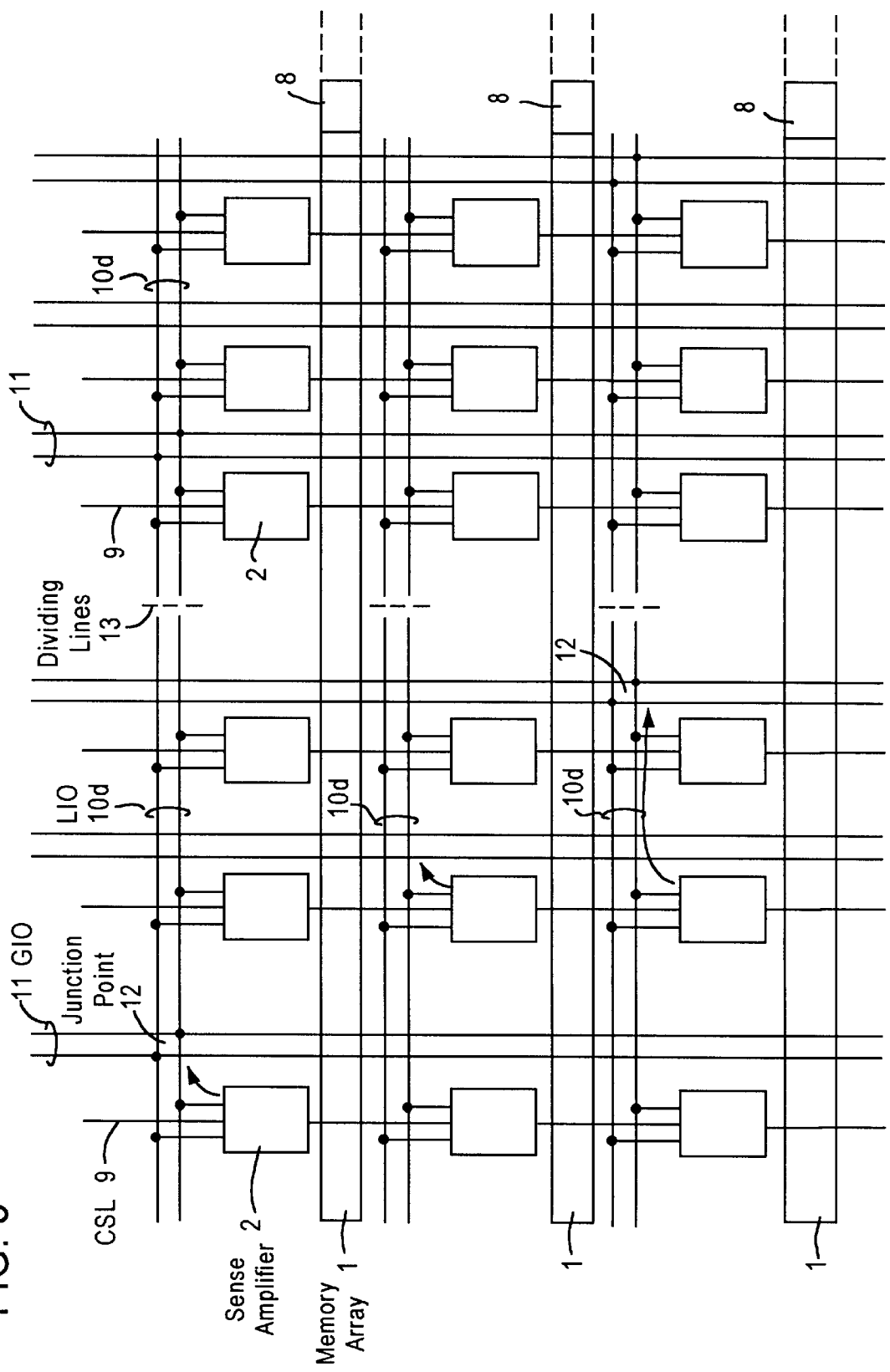
FIG. 5 is a diagram showing the architecture of memory-cell arrays in a semiconductor memory device of a third embodiment.

FIG. 5 is a diagram showing the architecture of memory-cell arrays in a semiconductor memory device of a third embodiment of the present invention. A multi-bit data bus is formed from a number of memory-cell arrays or memory banks. In the figure, the semiconductor memory device includes a memory-cell array 1 (or a memory bank 1) and a sense-amplifier unit 2 associated with the respective memory-cell array 1. A column-select line common 9 is associated with sense amplifiers 2 on the same column of the memory-cell arrays 1. A pair of local input/output signal lines 10d (or a pair of local I/O lines 10d) is disposed in common to a plurality of sense-amplifier units 2 of each memory-cell array 1 (or each memory bank 1). For the third embodiment, however, a pair of local input/output signal lines is not assigned to the entire memory-cell array 1 (or the entire memory bank 1). Instead, the pair of local input/output signal lines is divided into pairs of partial input/output signal lines 10d by dividing lines 13. Even though FIG. 5 shows only one dividing line 13, there may actually be as many dividing lines 13 as necessary. A pair of long global input/output signal lines 11 (or a pair of global I/O lines 11) is connected to one of the pairs of partial local input/output signal lines 10d. Either a word-line pile-driving unit 8 or a sub-word-line driving unit 8 is provided at the edge of each of the memory-cell arrays.

As shown in FIG. 5, a plurality of memory-array units 1 (or memory banks 1) is laid out in the memory-array areas of the third embodiment. The pair of global input/output signal lines 11 passes through the memory-cell arrays 1 (or the memory banks 1) 1. However, the pair of global input/output signal lines 11 is connected to only a specific pair of partial local input/output signal lines 10d at a junction point 12. Thus, there are as many pairs of global input/output signal lines 11 as there are pairs of partial local input/output signal lines 10d in a memory-cell array 1. That is to say, the pair of global input/output signal lines 11 is associated only with a specific pair of partial local input/output signal lines 10d, outputting and inputting only signals to and from a segment of the memory-cell array 1 connected to the specific pair of partial local input/output signal lines 10d. As a result, even though the column-select line 9 in this architecture is used in a similar manner as the ordinary system, there is no collision between data from a S non-activated memory-cell array and data from an activated memory-cell array.

In the semiconductor memory device having the architecture described above, signals are input from or output to a selected specific pair of partial local input/output signal lines 10d of a selected memory-cell array (or a selected memory bank) 1 through the associated pair of global input/output signal lines 11. As a result, segments of memory-cell arrays 1 (or segments of memory banks 1) connected to the specific pairs of partial local input/output signal lines 10d can operate concurrently. Thus, signals can be transmitted or received by different memory-cell arrays 1 (or different memory banks 1) in a multi-bank operation. Further, signals can also be transmitted or received by different pairs of partial local input/output signal lines 10d of the same memory-cell array 1 (or the same memory bank 1) concurrently in a multi-bit operation.

The architecture of the present embodiment can also be stated as follows. For memory-cell arrays in the conventional semiconductor memory device, a pair of local input/output signal lines (or a pair of local I/O lines) is normally provided for each region having a word-line shunting area provided on the edge thereof. For the third embodiment, however, the pair of input/output signal lines in the region is further divided into pairs of partial input/output signal lines which are each directly connected to a pair of global input/output signal lines (or a pair of global I/O lines) at a single location. That is to say, each pair of partial input/output signal lines is associated with a pair of global I/O lines on a one-to-one basis. Thus, a data bus having as many bits as pairs of partial input/output signal lines is created from an activated memory-cell array.

By designing memory-cell arrays into a multi-bank architecture such as a synchronous DRAM, it can be implemented by associating each memory-cell array 1 with a memory bank for a column-select line 9. In addition, since a pair of local input/output signal lines is divided into pairs of partial input/output signal lines as described above, an even greater number of data-bus routes can be formed in comparison with the architecture of the second embodiment as shown in FIG. 4. As a result, a multi-bank DRAM and memory-cell arrays having a multi-bit architecture can be implemented.

Fourth Embodiment

Figure 6:
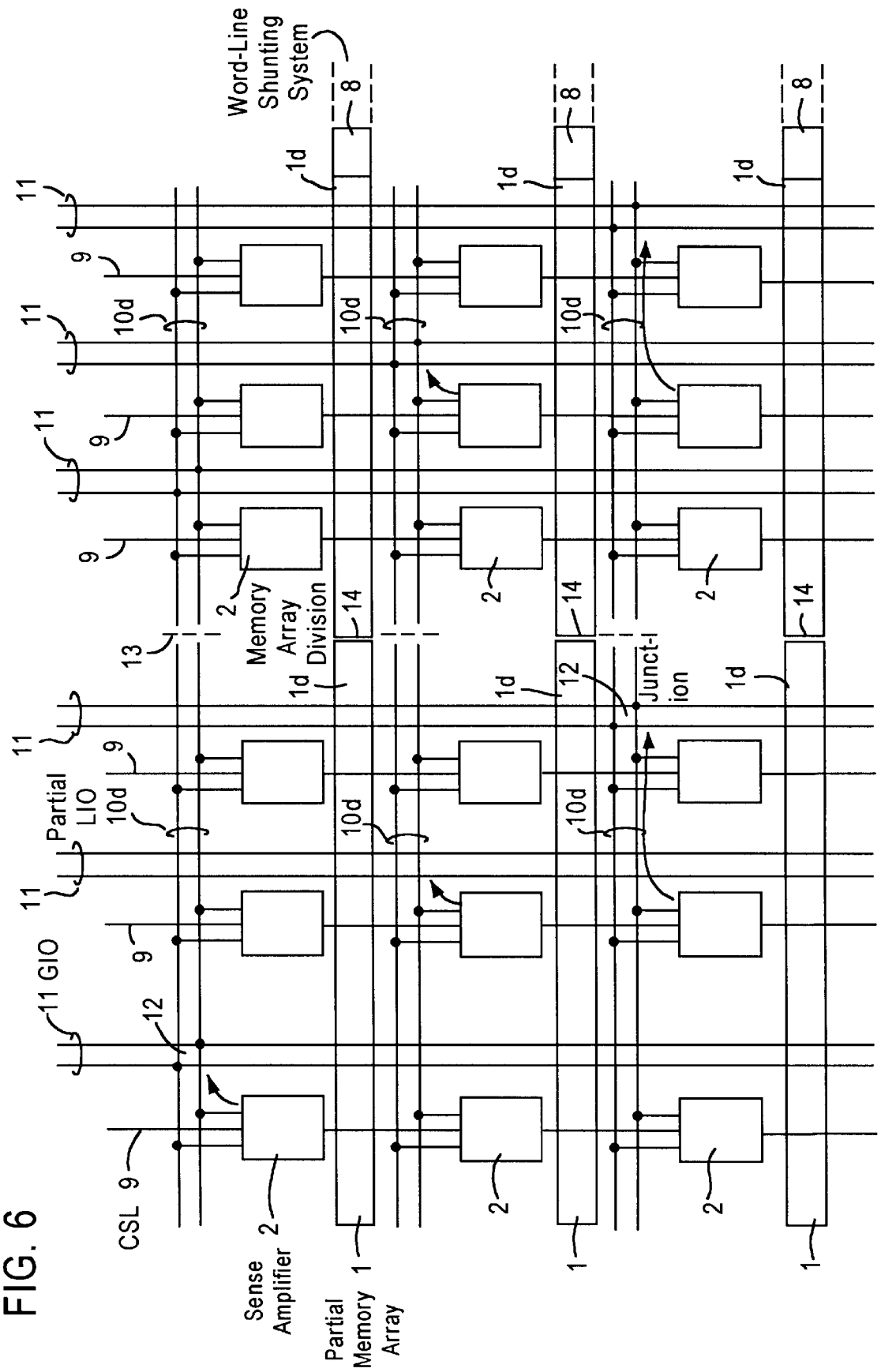
FIG. 6 is a diagram showing the architecture of memory-cell arrays in a semiconductor memory device of a fourth embodiment.

FIG. 6 is a diagram showing the architecture of memory-cell arrays in a semiconductor memory device of a fourth embodiment of the present invention. For the fourth embodiment, memory-cell arrays are designed into an architecture having even a greater number of memory banks. In the Figure, a memory-cell array is divided into a plurality of memory banks 10d in the word-line direction. Each memory bank id is associated with a pair of partial input/output signal lines 10d as in the third embodiment shown in FIG. 5. Each memory-cell array 1 can then be seen as an array divided into segments in the word-line direction. Conversely, the memory-cell array 1 is divided into necessary memory banks id, each associated with a pair of partial local input/output signal lines 10d. Each division of a pair of partial local input/output signal lines associated with the memory-cell array 1. The remaining part of the architecture is the same as that shown in FIG. 4 with the same numerical references denoting the identical components.

Compared to the memory-cell arrays having an architecture of the third embodiment shown in FIG. 5, the memory-cell arrays with an architecture of the fourth embodiment shown in FIG. 6 can meet the multi-bank requirement for a greater number of memory banks, because each of the memory-cell arrays 1 shown in FIG. 5 is divided into a plurality of memory banks id. Carrying out similar operations, the detailed explanation of the remaining part is not repeated to avoid duplication.

Fifth Embodiment

Figure 7:
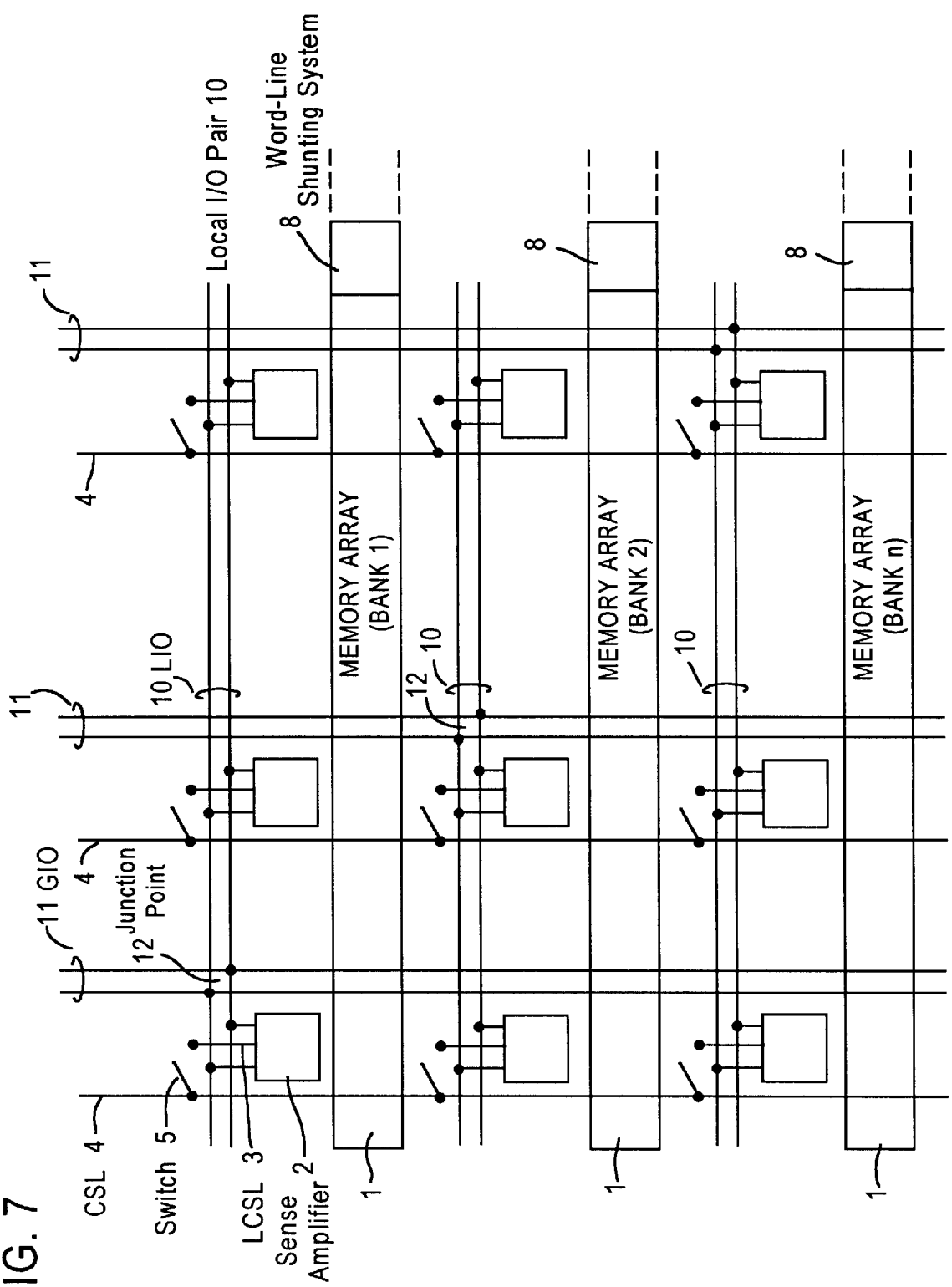
FIG. 7 is a diagram showing the architecture of memory-cell arrays in a semiconductor memory device of a fifth embodiment.

FIG. 7 is a diagram showing the architecture of memory-cell arrays in a semiconductor memory device of a fifth embodiment of the present invention. The fifth embodiment is a typical multi-bank architecture of memory-cell arrays, each associated with a memory bank. In the Figure, the semiconductor memory device includes a memory-cell array 1 (or a memory bank 1) and a sense-amplifier unit 2 associated with the memory-cell array 1 respectively. A short local column-select line 3 is connected to the sense-amplifier unit 2, and a global column-select line 4 is commonly disposed to all sense-amplifier units 2 on the same column of the memory-cell arrays 1. A switch 5 turns on and off the electrical connection between the local column-select line 3 and the global column-select line 4. A pair of local input/output signal lines 10 (or a pair of local I/O lines 10) is provided for each memory-cell array 1 (or each memory bank 1). The pair of local input/output signal lines 10 (or the pair of local I/O lines 10) are common to a plurality of sense amplifiers 2 in the memory-cell array 1 (or memory bank 1). A pair of long global input/output signal lines 11 (or a pair of global I/O lines 11) is connected to a specific pair of local input/output signal lines 10. Either a word-line pile-driving unit 8 or a sub-word-line driving unit 8 is provided at the edge of each of the memory-cell arrays.

As shown in the Figure, a plurality of memory-cell arrays 1 (or a plurality of memory banks 1) is laid out in the memory-array areas of the fifth embodiment. A column-select line (CSL) passing through the memory-cell arrays (or memory banks) 1 is configured into a hierarchical structure comprising a local line 3 at a local level and a global line 4 at a global level for each column. In addition, a pair of global input/output signal lines 11 passes through the memory-cell arrays 1 (or the memory banks 1) for each column of sense-amplifier units 2. The pair of global input/output signal lines 11 is connected only to a specific pair of local input/output signal lines 10 associated with a memory-cell array 1 (or a memory bank 1) at a junction point 12. In other words, a pair of global input/output signal lines 11 transmits and receives signals only to and from the memory-cell array 1, with which it is associated.

In the semiconductor memory device having the architecture described above, the column-select line switch 5 in a selected memory-cell array 1 is turned on, connecting the global column-select line 4 to the local column-select line 3. The sense-amplifier unit 2 is connected directly to the pair of global input/output signal lines 11, resulting in a conductive state. A signal is transmitted from or received to a selected memory-cell array 1 through a specific pair of global input/output signal lines 11, allowing memory-cell arrays 1 (or memory banks 1) to operate concurrently. As a result, a multi-bank operation can be carried out.

The architecture of the fifth embodiment is obtained from the multi-bank architecture of a memory device of the second embodiment shown in FIG. 4 by replacing the column-select line of the conventional system with a column-select line with a hierarchical structure comprising a local line 3 at a local level and a global line 4 at a global level much like the first embodiment shown in FIG. 3. Except for the operation of the column-select line, the fifth embodiment works in the same way as the memory-cell arrays of the second embodiment shown in FIG. 4. For this reason, the explanation of the operation carried out by the fifth embodiment is omitted to avoid duplication.

Compared to the second embodiment shown in FIG. 5, the column-select line of the fifth embodiment has a hierarchical structure comprising a local line 3 at a local level and a global line 4 at a global level which are disconnected from each other except during operation. As a result, the load of the pair of global column-select line 11 is reduced, allowing a high speed and low power operation.

Sixth Embodiment

Figure 8:
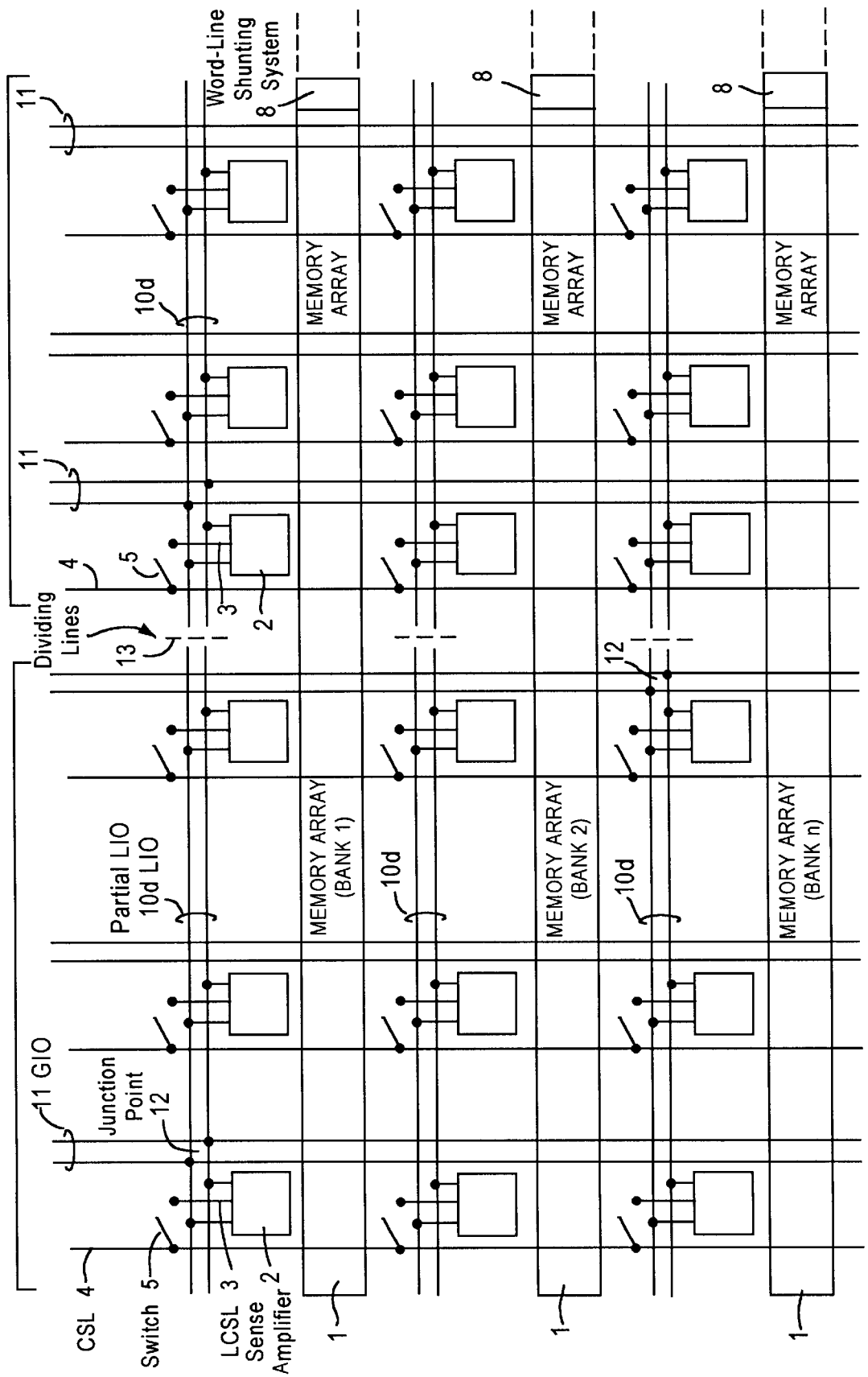
FIG. 8 is a diagram showing the architecture of memory-cell arrays in a semiconductor memory device of a sixth embodiment.

FIG. 8 is a diagram showing the architecture of memory-cell arrays in a semiconductor memory device of a sixth embodiment of the present invention. It is another architecture in which a multi-bit data bus is formed from a number of memory-cell arrays or memory banks. In the Figure, the semiconductor memory device includes a memory-cell array 1 (or a memory bank 1) and a sense-amplifier unit 2 associated with the respective memory-cell array 1. A local column-select line 3 and a global column-select line 4 is disposed in a hierarchical structure. A switch 5 turns on and off the electrical connection between the local and global column-select lines 3 and 4. A pair of local input/output signal lines 10d (or a pair of local I/O lines 10d) and a pair of long global input/output signal lines 11 (or a pair of global I/O lines 11) are crosswise disposed. Either a word-line pile-driving unit 8 or a sub-word-line driving unit 8 is provided at the edge of each of the memory-cell arrays.

All components employed in the sixth embodiment are the same as those of the fifth embodiment shown in FIG. 7, except that, here the pair of local input/output signal lines 10 of the fifth embodiment is divided into a plurality of pairs of partial local input/output signal lines 10d in the word-line direction.

In addition, compared to the third embodiment having the same column-select line 9 as the conventional architecture shown in FIG. 5, the sixth embodiment has an architecture shown in FIG. 8 in which the column-select line has a hierarchical structure comprising a local line 3 at a local level and a global line 4 at a global level which are turned on and off by the column-select line switch 5. Otherwise the operation carried out by the sixth embodiment is the same as that of the third embodiment, so a detailed explanation of the operation of the sixth embodiment is omitted to avoid duplication.

In a semiconductor memory device having such an architecture, since a signal is received from or transmitted to a selected pair of partial local input/output signal lines 10d of a selected memory-cell array through a specific pair of global input/output signal lines 11, memory-cell arrays 1 (or memory banks 1) associated with selected pairs of partial local input/output signal lines 10d can operate concurrently. As a result, signals can be transmitted or received by different memory-cell arrays 1 (or different memory banks 1) in a multi-bank operation. Signals can also be transmitted or received by different pairs of partial local input/output signal lines 10d of the same memory-cell array 1 (or the same memory bank 1) concurrently in a multi-bit operation.

The architecture of the sixth embodiment can also be stated as follows. For memory-cell arrays in the conventional semiconductor memory device, a pair of local input/output signal lines (or a pair of local I/O lines) is normally provided for each region having a word-line shunting area provided on its edge. For the sixth embodiment, however, the pair of input/output signal lines in the region is further divided into pairs of partial input/output signal lines, each directly connected to a pair of global input/output signal lines (a pair of global I/O lines) at a single location. Each pair of partial input/output signal lines is associated with a pair of global I/O lines on a one-to-one basis. Thus, a data bus having as many bits as pairs of partial input/output signal lines is created from an activated memory-cell array.

By designing memory-cell arrays this way, a multi-bank architecture such as a synchronous DRAM can be implemented by associating each memory-cell array 1 with a memory bank for a column-select line 9. Since a pair of local input/output signal lines is divided into pairs of partial input/output signal lines as described above, an even greater number of data-bus routes can be formed compared to the architecture of the fifth embodiment shown in FIG. 7. As a result, a multi-bank DRAM and memory-cell arrays having a multi-bit architecture can be implemented.

Since the global column-select line CSL has a hierarchical structure in the case of the sixth embodiment, the load of the global column-select line CSL is reduced, allowing high speed and low power operation.

Seventh Embodiment

Figure 9:
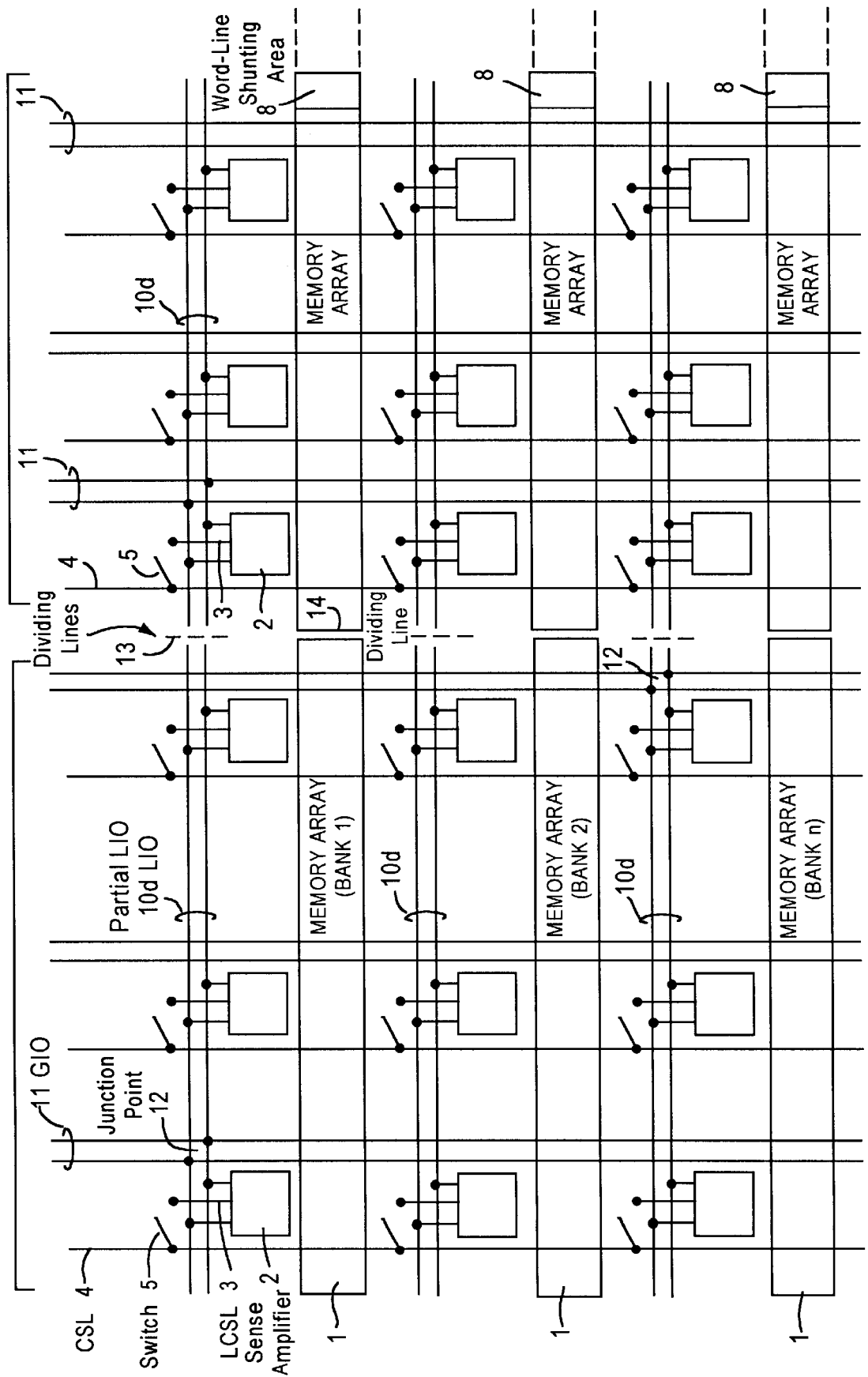
FIG. 9 is a diagram showing the architecture of memory-cell arrays in a semiconductor memory device of a seventh embodiment.
Figure 12:
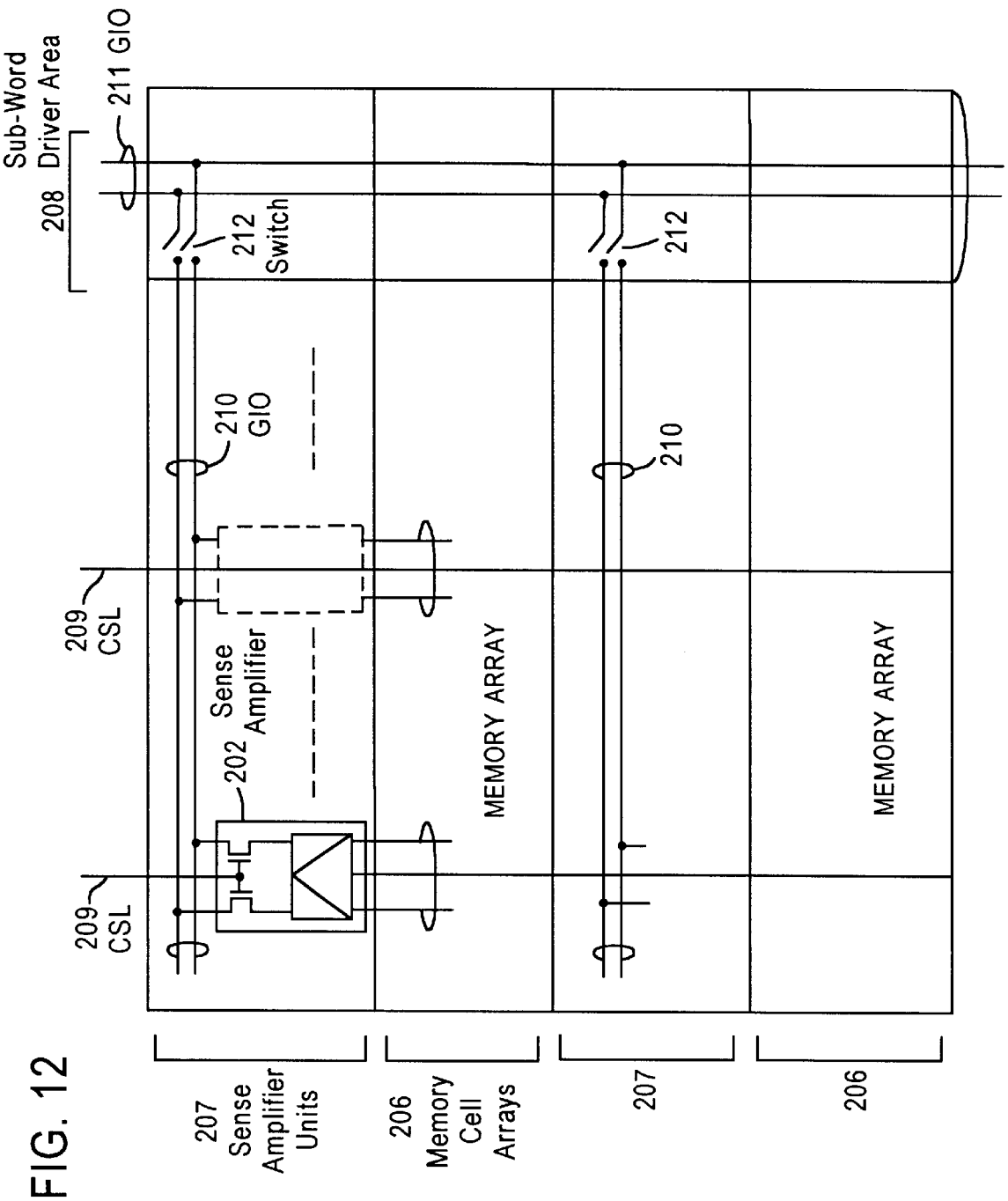
FIG. 12 is a diagram showing the architecture of memory-cell arrays in a conventional semiconductor memory device.

FIG. 9 is a diagram showing the architecture of memory-cell arrays in a semiconductor memory device of a seventh embodiment of the present invention. The seventh embodiment is a typical multi-bank architecture of memory-cell arrays. As shown in the Figure, a memory-cell array 1 is divided into a plurality of memory banks id in the word-line direction. The memory banks id each correspond to a pair of partial input/output signal lines 10d in the sixth embodiment shown in FIG. 8. Each memory-cell array 1 can then be seen as an array divided into portions in the word-line direction. Conversely, the memory-cell array 1 is divided into necessary memory banks id which are each associated with a pair of partial local input/output signal lines 10d. Each division of a pair of local input/output signal lines is associated with the memory-cell array 1. The remaining part of the architecture is the same as that shown in FIG. 8 with the same numerical references denoting identical components.

Compared to the memory-cell arrays having an architecture provided by the sixth embodiment shown in FIG. 8, the memory-cell arrays in this architecture can meet a multi-bank requirement with an increasing number of memory banks, because each memory-cell array 1 shown in FIG. 8 is divided into a plurality of memory banks 1d. Carrying out similar operations, the detailed explanation of the remaining part is not repeated to avoid duplication.

Eighth Embodiment

FIGS. 10(a) to 10(d) and FIGS. 11(a) to 11(d) each show an architecture of a semiconductor memory device of an eighth embodiment of the present invention. This embodiment implements a layout of conductive leads in a memory-cell array of a semiconductor memory device provided by each embodiment described so far.

In the structure of a conventional semiconductor memory device, a plurality of conductive leads is disposed on an area of a plurality of memory cells. In general, the structure is a two-layer structure comprising a first metal lead layer used for word-lines and a second metal lead layer serving as column-select lines and power-supply lines. First, the lead structure of the semiconductor memory device of the present invention shown in FIG. 10(a) to 10(d) is a three-layer structure. FIG. 10(a) is a conceptual diagram showing the concept of word-lines. A first metal lead layer shown in FIG. 10(b) is used as a layer of word-lines much like the conventional architecture. A second metal lead layer shown in FIG. 10(c) serves as a layer of global column-select lines and global I/O lines, while a third metal lead layer shown in FIG. 10(d) is used for power-supply lines. An alternative three-layer structure is shown in FIG. 11. In this structure, the first metal lead layer shown in FIG. 11(a) is used as a layer of word-lines, and the second metal lead layer shown in FIG. 10(b) serves as a layer of global column-select lines and power-supply lines. The third metal lead layer shown in FIG. 10(c) is used as a layer of global I/O lines.

In each embodiment described so far, the semiconductor memory device has a multi-bit architecture. It is thus necessary to provide as many pairs of global input/output signal lines as sense amplifiers in the word-line direction. Alternatively, it is necessary to provide as many pairs of global input/output signal lines as memory banks required for building a multi-bank architecture. As a result, the conductive lead density of the conventional two-layer structure is increased, making it difficult to design the layout thereof. For this reason, the present invention adopts a more stable three-layer lead structure.

As described so far, the present invention provides as many input/output signal lines in a hierarchical fashion as memory-array banks. Alternatively, the present invention provides many input/output signal lines in a hierarchical fashion corresponding to each sense amplifier or each group of sense amplifiers. Thus, it implements a semiconductor memory device having a multi-bank memory-cell array, a multi-bit memory-cell array or a multi-bank and multi-bit memory-cell array.

The foregoing embodiments are merely exemplary and should not be construed as limiting the basic concept of an architecture of a semiconductor memory device.

What is claimed is:

1. A semiconductor memory device comprising:
   a plurality of memory arrays arranged along a first direction, each including a bit line data bus disposed along the first direction and a plurality of memory cells coupled to the bit line data bus;
   a plurality of sense amplifiers provided corresponding to the bit line data buses included in said plurality of memory arrays;
   a column select line arranged along the first direction and provided in common to said plurality of sense amplifiers; and
   a global data bus arranged along the first direction, disposed on said plurality of memory arrays and coupled in common to said plurality of sense amplifiers.

2. The semiconductor memory device according to claim 1, wherein each of the bit line data buses includes a pair of bit lines, and said global data bus includes a pair of global data lines.

3. The semiconductor memory device according to claim 1, further comprising:
   a plurality of transfer circuits coupled between said plurality of sense amplifiers and said global data bus respectively, and being responsive to a signal transmitted by said column select line.

4. The semiconductor memory device according to claim 3, wherein
   said plurality of transfer circuits are responsive to whether corresponding memory arrays are selected.

5. The semiconductor memory device according to claim 3, wherein each of said plurality of transfer circuits includes
   a transfer transistor coupled between a corresponding one of said plurality of sense amplifiers and said global data bus, and
   a switch coupled between a gate of said transfer transistor and said column select line.

6. The semiconductor memory device according to claim 1, further comprising:
   a plurality of local data buses corresponding to said plurality of sense amplifiers, each coupled between a corresponding sense amplifier and said global data bus.

7. The semiconductor memory device according to claim 6, wherein
   said plurality of local data buses are directly connected to said global data bus.

8. The semiconductor memory device to claim 6, wherein
   said plurality of local data buses is disposed along a second direction transverse to the first direction.

9. A semiconductor memory device comprising:
   a plurality of memory arrays arranged along a first direction, each including a plurality of bit line data buses each disposed along the first direction and a plurality of memory cells coupled to the bit line data buses;
   a plurality of sense amplifiers provided corresponding to the bit line data buses included in said plurality of memory arrays, and divided into a plurality of sense amplifier groups corresponding to said plurality of memory arrays;

a plurality of column select lines each arranged along the first direction and each provided in common to a corresponding plurality of sense amplifiers corresponding to said plurality of memory arrays respectively;

a plurality of local data buses provided corresponding to the plurality of sense amplifier groups, disposed along a second direction crossing to the first direction, and each coupled to the sense amplifiers included in a corresponding one of the plurality of sense amplifier groups; and a plurality of global data buses provided corresponding to said plurality of local data buses respectively, each disposed along the first direction, and each connected to a corresponding one of said plurality of local data buses.

10. The semiconductor memory device according to claim 9, wherein each of the bit line data buses includes a pair of bit lines, each of said plurality of local data buses includes a pair of local data lines, and each of said plurality of global data buses includes a pair of global data lines.

11. The semiconductor memory device according to claim 9, wherein each of said plurality of global data buses is directly connected to the corresponding one of said plurality of local data buses.

12. The semiconductor memory device according to claim 9, further comprising:

a plurality of transfer circuits provided corresponding to said plurality of sense amplifiers respectively, each coupled between a corresponding one of said plurality of sense amplifiers and a corresponding one of said plurality of local data bases, and each being responsive to a signal transmitted by a corresponding one of said plurality of column select lines.

13. The semiconductor memory device according to claim 12, wherein each of said plurality of transfer circuits includes a transfer transistor having a gate directly connected to the corresponding one of said plurality of column select lines.

14. The semiconductor memory device according to claim 12, wherein said plurality of transfer circuits are responsive to whether corresponding memory arrays are selected.

15. The semiconductor memory device according to claim 12, wherein each of said plurality of transfer circuits includes a transfer transistor coupled between a corresponding one of said plurality of sense amplifiers and a corresponding one of said plurality of local data buses, and a switch coupled between a gate of said transfer transistor and a corresponding one of said plurality of column select lines.

16. A semiconductor memory device comprising:

a plurality of memory arrays each including a bit line data bus and a plurality of memory cells coupled to the bit line data bus;

a plurality of sense amplifiers provided corresponding to the bit line data buses included in said plurality of memory arrays;

a plurality of local data buses provided corresponding to said plurality of sense amplifiers respectively and each coupled to a corresponding one of said plurality of sense amplifiers;

a plurality of global data buses provided corresponding to said plurality of local data buses respectively and each directly connected to a corresponding one of said plurality of local data buses;

a plurality of select lines provided corresponding to said plurality of sense amplifiers respectively; and a plurality of transfer circuits provided corresponding to said plurality of sense amplifiers respectively, each coupled between a corresponding one of said plurality of sense amplifiers and a corresponding one of said plurality of local data buses, and each responsive to a signal transmitted by a corresponding one of said plurality of select lines.

17. The semiconductor memory device according to claim 16, wherein each of said plurality of transfer circuits includes a transfer transistor coupled between the corresponding one of said plurality of sense amplifiers and the corresponding one of said plurality of local data buses, and a switch coupled between a gate of said transfer transistor and the corresponding one of said plurality of select lines.

18. The semiconductor memory device according to claim 17, wherein said plurality of global data buses is disposed along a first direction, and said plurality of local data buses is disposed along a second direction crossing the first direction.

19. A semiconductor memory device comprising:

a plurality of memory arrays each including a bit line data bus and a plurality of memory cells coupled to the bit line data bus;

a plurality of sense amplifiers provided corresponding to the bit line data buses included in said plurality of memory arrays;

a plurality of local data buses provided corresponding to said plurality of sense amplifiers respectively and each coupled to a corresponding one of said plurality of sense amplifiers;

a global data bus provided in common to said plurality of local data buses and directly connected to said plurality of local data buses;

a plurality of transfer circuits provided corresponding to said plurality of sense amplifiers respectively, each coupled between a corresponding one of said plurality of sense amplifiers and a corresponding one of said plurality of local data buses, and each responsive to a select signal.

20. The semiconductor memory device according to claim 19, wherein the select signals, to which said plurality of transfer circuits are respectively responsive, are transmitted by a common select line.

21. The semiconductor memory device according to claim 19, wherein each of said plurality of transfer circuits includes a transfer transistor coupled between the corresponding one of said plurality of sense amplifiers and the corresponding one of said plurality of local data buses, and a switch coupled to a gate of said transfer transistor, for applying the select signal to the gate.

22. The semiconductor memory device according to claim 21, wherein said global data bus is disposed along a first direction, and said plurality of local data buses are disposed along a second direction crossing the first direction.

* * * * *

UNITED STATES PATENT AND TRADEMARK OFFICE
CERTIFICATE OF CORRECTION

PATENT NO. : 6,249,474 B1
DATED : June 19, 2001
INVENTOR(S) : Kazutami Arimoto

It is certified that error appears in the above-identified patent and that said Letters Patent is hereby corrected as shown below:

<u>Title page,</u>
Item [75], Inventor, change the first name of the inventor from "Kazutani" to
-- Kazutami --.

Signed and Sealed this

Fifteenth Day of January, 2002

*Attest:*

*Attesting Officer*

JAMES E. ROGAN
*Director of the United States Patent and Trademark Office*